United States Patent
Matsugatani et al.

(12)

(10) Patent No.: US 6,621,345 B2
(45) Date of Patent: Sep. 16, 2003

(54) GAIN CONTROL DEVICE FOR PACKET SIGNAL RECEIVER

(75) Inventors: Kazuoki Matsugatani, Kariya (JP); Kunihiko Sasaki, Kuwana (JP)

(73) Assignee: Denso Corporation, Kariya (JP)

( * ) Notice: Subject to any disclaimer, the term of this patent is extended or adjusted under 35 U.S.C. 154(b) by 63 days.

(21) Appl. No.: 09/826,450

(22) Filed: Apr. 4, 2001

(65) Prior Publication Data

US 2001/0028275 A1 Oct. 11, 2001

(30) Foreign Application Priority Data

Apr. 4, 2000 (JP) ........................................ 2000-102656

(51) Int. Cl.[7] ................................................ H03G 3/10
(52) U.S. Cl. ........................ 330/281; 330/129; 330/141
(58) Field of Search ................................. 330/129, 140, 330/141, 281, 130; 327/246, 270; 455/240.1, 244.1

(56) References Cited

U.S. PATENT DOCUMENTS 4,928,307 A * 5/1990 Lynn ........................... 379/395
5,752,171 A * 5/1998 Akiya ......................... 455/126
6,151,400 A * 11/2000 Seligman ..................... 381/317

FOREIGN PATENT DOCUMENTS

| JP | 09-307601 | 11/1997 |
| JP | 11-136294 | 5/1999 |

* cited by examiner

Primary Examiner—Henry Choe
(74) Attorney, Agent, or Firm—Harness, Dickey & Pierce, PLC

(57) ABSTRACT

In a gain control device for packet signal receiver, a variable gain amplifier amplifies an input signal with a gain corresponding to a control voltage applied thereto, and a power detector detects output power of the variable gain amplifier. A packet detection circuit detects a packet signal based on the detected output power. A control circuit outputs the control voltage variable with the detected output power, and the control voltage is provided for the amplifier. Thus high-speed gain control is performed immediately after the start of detection of the packet signal. When the elapsed time after the start of detection of the packet signal exceeds a predetermined time, a sample-hold circuit sample-and-holds the control voltage. This control voltage is provided for the amplifier up to the end of reception of the packet signal thereafter. Thus low-speed gain control is performed to provide stable power without distorting the signal wave.

6 Claims, 8 Drawing Sheets

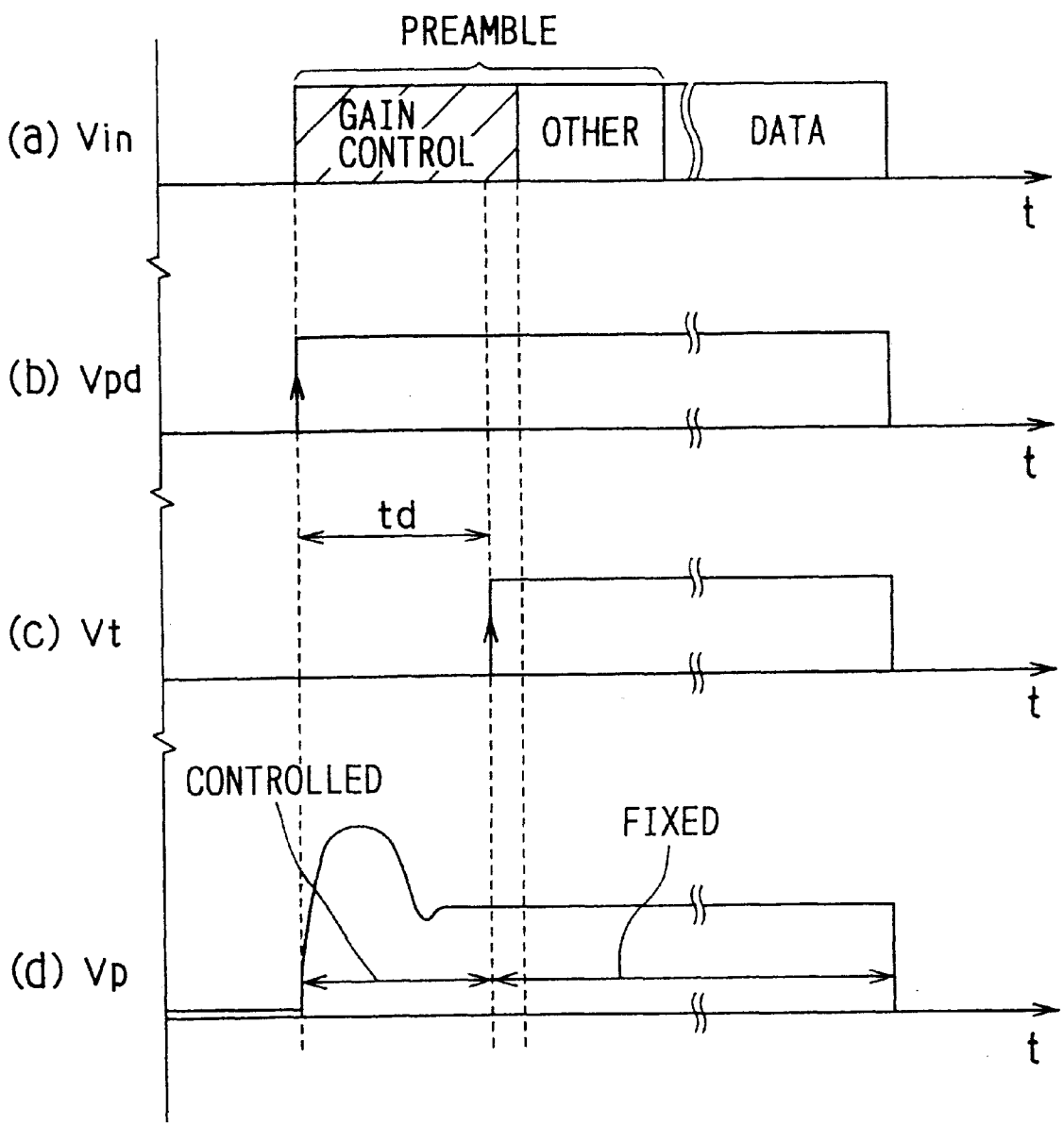

GAIN CONTROL DEVICE FOR PACKET SIGNAL RECEIVER

CROSS REFERENCE TO RELATED APPLICATION

This application is based on and incorporates herein by reference Japanese Patent Application No. 2000-102656 field Apr. 4, 2000.

BACKGROUND OF THE INVENTION

1. Field of the Invention

The present invention relates to a gain control device for performing gain control of received signals, and particularly to a gain control device suitable for reception of packet signals.

2. Related Art

It is proposed to employ communication using packets (i.e., communication in which signals are transmitted/received at random and non-predetermined times, instead of communication using time slots (i.e., communication in which signals are transmitted/received at predetermined times), as a means for matching in a computer network.

Further, communication techniques such as QAM or OFDM, in which the amplitude of a signal will greatly vary, are proposed for improving a transmission rate.

In a digital receiver, signals are sampled by an A/D converter. In order to obtain signals accurately, it is desirable to make full use of the dynamic range of the A/D converter. On the other hand, particularly in mobile communication systems, received power will widely vary depending on the distance between communication terminals. Therefore, in order to make full use of the dynamic range of the A/D converter as described above, a gain control device capable of controlling received power to provide constant power regardless of the magnitude of the received power is needed at the input side of the A/D converter.

In order for the gain control device to be applied to packet communication, it should detect a packet signal transmitted at random and non-predetermined times, and perform gain control at high speed for immediately regulating the signal to the constant output power. However, the signal wave will be distorted if the gain is controlled in direct response to variation in the signal amplitude. Thus, in this case, it should perform gain control of the signal at low speed.

JP-A-9-307601 proposed a gain control device for gain control of QAM transmitting waves. In this device, a component of envelope detection of transmitting waves (i.e., voltage values corresponding to power) is sampled-and-held and integrated for performing gain control. Further, in this device, the period of sampling-and-holding is set short immediately after the start of transmitting so that a control rate is made higher. After a while, the period is set longer in order to make the control rate lower. This technique is limited to transmitting waves. In the case of transmitting waves, control can be accomplished easily since the time when a signal is transmitted is known. However the technique is not applicable to received signals without modification. Particularly it is not applicable to received signals in packet communication because the time when a signal is received is unknown. Further, this device sample-and-holds a signal and generates step waves before passing the waves through an integration circuit for generating a control signal. In this case, compared to the case of integrating continuous waves, quantization errors are produced and as a result control precision is lowered.

SUMMARY OF THE INVENTION

The present invention overcomes the above drawbacks, and has an object to provide a gain control device which is capable of performing gain control of packet signals at a signal receiver side.

The gain control device according to the present invention is for a receiver used in packet communication. In response to reception of a packet signal, the device begins to perform high-speed gain control of the signal. Thus the output power of the device is controlled stably immediately after the start of reception of the signal. Thereafter, the device shifts from a high-speed gain control mode to a low-speed gain control mode after the output power has converged. Thus, the gain control does not follow variation in the signal amplitude and the device can provide stable output power without distorting the signal wave. Alternatively the device may compensate for the output power, which is provided as a result of high-speed gain control, by a control voltage used for controlling the gain for stabilizing the output power.

BRIEF DESCRIPTION OF THE DRAWINGS

The above and other objects, features and advantages of the present invention will become more apparent from the following detailed description made with reference to the accompanying drawings. In the drawings:

FIG. 2 is a timing chart of signals developed in various parts in the first embodiment;

DETAILED DESCRIPTION OF THE PREFERRED EMBODIMENT

Figure 1:
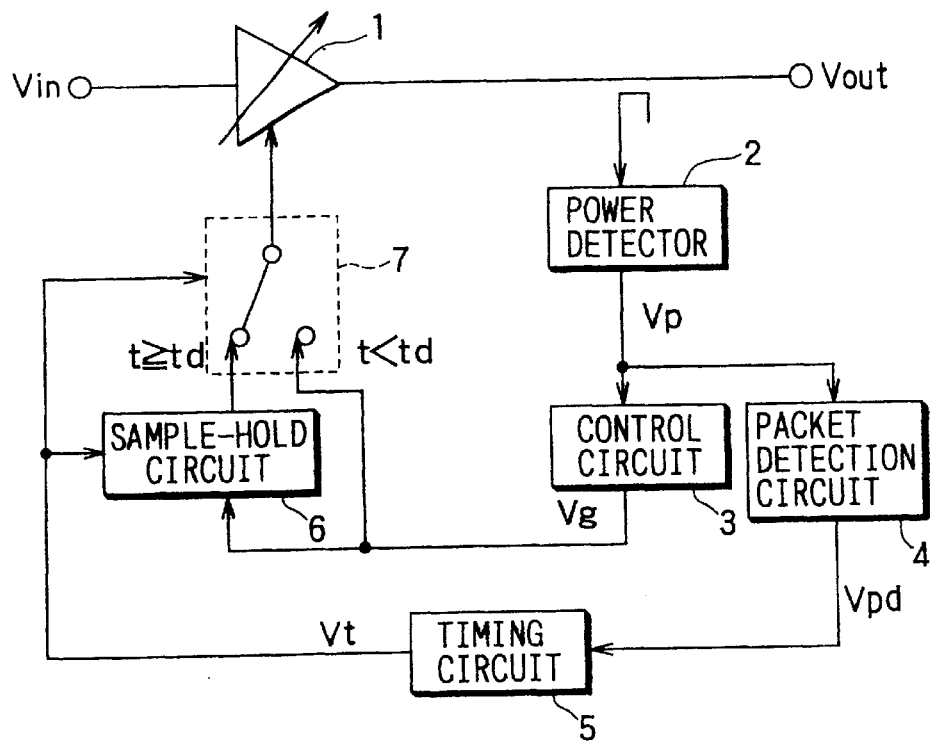
FIG. 1 is a block diagram showing a gain control device according to a first embodiment of the present invention.

The present invention will be described hereinafter with reference to embodiments and modifications in which like reference numerals denote like elements of circuit construction.

First Embodiment

Referring to FIG. 1 showing a first embodiment of the present invention, a gain control device is disposed in a receiver used in mobile communication, and used for receiving a signal transmitted by means of a packet communication technique in which the amplitude of a signal largely varies. This device is used for converting the received signal to an IF signal by a mixer, and for controlling gain of the IF signal. Output voltage which is provided by the present gain control device as a result of gain control is input to, for example, a vector demodulator via a A/D converter (not shown). However, devices connected to the input and output of the gain control device are not limited to the mixer and the vector demodulator. For example, a demodulator may be connected to the input and a digital demodulator may be connected to the output.

The gain control device has a construction suitable for controlling gain of a packet signal in response to reception of the signal. A packet signal comprises a preamble and data. The preamble comprises a preamble portion for gain control, a preamble portion for frequency control, a preamble portion for timing control and so on. The preamble portion for gain control is arranged in the head of the signal.

The gain control device comprises a variable gain amplifier 1, a power detector 2, a control circuit 3, a packet detection circuit 4, a timing circuit 5, a sample-hold circuit 6, and a switch circuit 7.

The variable gain amplifier 1 amplifies an input signal Vin with a gain corresponding to a control voltage applied thereto. The power detector 2 outputs a voltage Vp corresponding to output power of the variable gain amplifier 1. The control circuit 3 compares the output voltage Vp with a target voltage, and outputs a control voltage Vg for controlling the output power of the variable gain amplifier 1 so that it approaches a target value.

The packet detection circuit 4 detects a packet signal by comparing the output voltage Vp of the power detector 2 with a predetermined threshold (a first threshold). It will output a high-level packet detection signal Vpd while the output voltage Vp of the power detector 2 exceeds the first threshold. The timing circuit 5 includes a circuit for measuring time. It measures the time elapsed after the start of outputting of the packet detection signal. When a predetermined time td has elapsed, it begins to output a high-level timing signal Vt, and it will continue to output the timing signal Vt while the packet detection signal Vpd is output from the packet detection circuit 4.

The sample-hold circuit 6 sample-and-holds the control voltage Vg from the control circuit 3 in response to the timing signal Vt from the timing circuit 5. The switch circuit 7 provides the control voltage Vg from the control circuit 3 for the variable gain amplifier 1 until the timing circuit 5 starts to output the timing signal Vt, and provides the control voltage Vg sampled-and-held by the sample-hold circuit 6 for the variable gain amplifier 1 while the timing circuit 5 outputs the timing signal Vt. The switch circuit 7 is formed by, for example, a semiconductor switch.

Next the operation of the first embodiment is explained. In FIG. 2, signals developed in various parts in this embodiment are shown, and (a) shows the input signal Vin for the gain control device, (b) shows the output signal Vpd from the packet detection circuit 4, (c) shows the output signal Vt from the timing circuit 5 and (d) shows the output voltage Vp of the power detector 2 corresponding to the output power of the variable gain amplifier 1.

While a packet signal is not received, the voltage Vp from the power detector 2 is at low voltage level, and the control circuit 3 outputs the control voltage Vg for controlling the output power from the variable gain amplifier 1 with respect to the target value based on the output voltage Vp of the power detector 2. In this state, the packet detection circuit 4 will not detect a packet signal, so the switch circuit 7 provides the control voltage Vg from the control circuit 3 for the variable gain amplifier 1. By such a feedback loop, the variable gain amplifier 1 will amplify the input signal Vin with a high gain.

Thereafter, in response to reception of a packet signal, the output power of the variable gain amplifier 1 will rise, and the voltage Vp from the power detector 2 also rises. When the voltage Vp exceeds the first threshold, a packet detection signal Vpd is output from the packet detection circuit 4. In response to the packet detection signal Vpd, the timing circuit 5 begins to measure an elapsed time. Until the elapsed time reaches a predetermined time td, the timing circuit 5 will not output a timing signal. Therefore the control voltage Vg from the control circuit 3 is provided for the variable gain amplifier 1 via the switch circuit 7, and the variable gain amplifier 1 is controlled with high gain. While controlling with high gain, the output power of the variable gain amplifier 1 changes as shown in (d) of FIG. 2 by overshooting a fixed power level assumed after a predetermined time td (as will be described).

The predetermined time td is set shorter than the receiving time of the preamble portion for gain control, but longer than the time the output power of the variable gain amplifier 1 converges to the target value. Consequently, by the end of the elapse of the predetermined time td, the output power of the variable gain amplifier 1 converges to a stable output power level. The predetermined time td can be set longer than the receiving time of the preamble portion for gain control to the extent that it also covers receiving time of the other preamble portions, if demodulation of the other preamble portions will not be affected. However the predetermined time td needs to be shorter than the receiving time of the entire preamble of one packet signal.

When the predetermined time td has elapsed, a timing signal Vt is output from the timing circuit 5. In response to the timing signal Vt, the sample-hold circuit 6 sample-and-holds the control voltage Vg from the control circuit 3, and the switch circuit 7 switches to provide the control voltage Vg held by the sample-hold circuit 6 for the variable gain amplifier 1. Thus the variable gain amplifier 1 amplifies the input signal Vin with the fixed gain thereafter.

After that, when the variable gain amplifier 1 receives no packet signal, its output power drops, and the voltage Vp from the power detector 2 also drops. Accordingly the packet detection signal Vpd is not output, and the timing signal Vt is not output either. As a result, the switch circuit 7 switches to provide the control voltage Vg from the control circuit 3 for the variable gain amplifier 1. Then the variable gain amplifier 1 returns to the same state as before the start of reception of the packet signal.

Consequently, in the first embodiment, the gain control device begins gain control mode in response to detection of a packet signal, and performs gain control at high speed. Thereafter, when the predetermined time td has elapsed, it begins a fixed gain mode. In this way, the output power is controlled stably immediately in response to detection of the packet signal by high-speed gain control, and after that, with fixed gain, the stable power is output without distorting the signal wave.

Second Embodiment

Figure 3:
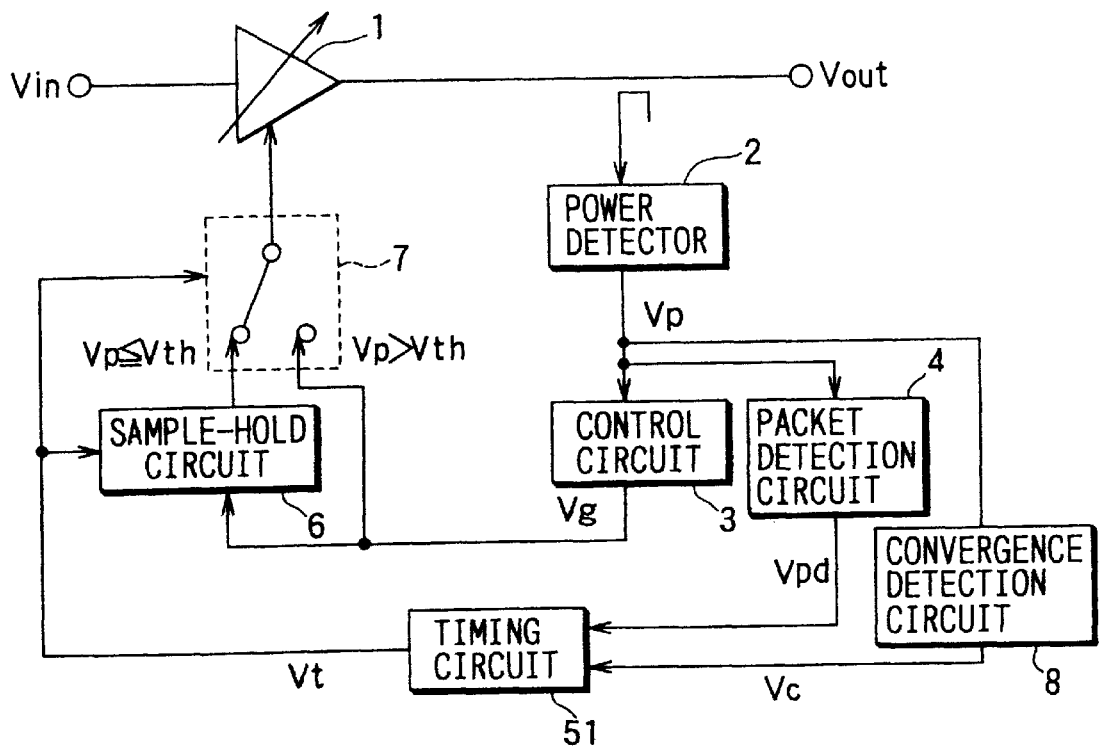
FIG. 3 is a block diagram showing a gain control device according to a second embodiment of the present invention.

In a second embodiment of the present invention, shown in FIG. 3, the predetermined time td is not measured.

Instead, when it is detected that the output voltage Vp of the power detector 2 is below a predetermined threshold (i.e., a second threshold Vth higher than the first threshold) and in a convergent state after it exceeds the second threshold, a gain control device shifts from the gain control mode to the fixed gain mode.

Therefore the gain control device according to the second embodiment includes a convergence detection circuit 8 which detects a time point of convergence, that is, when the output voltage Vp of the power detector 2 falls below the second threshold Vth after it exceeds the second threshold Vth, and outputs a convergence detection signal Vc while the output voltage Vp of the power detector 2 is higher than a third threshold that is lower than the second threshold Vth.

The convergence detection circuit 8 is formed by, for example, a first comparator, a second comparator, and an output circuit. The first comparator compares the output voltage Vp from the power detector 2 with the second threshold Vth, and outputs a high-level signal while the output voltage Vp of the power detector 2 is equal or higher than the second threshold Vth. The second comparator compares the output voltage Vp of the power detector 2 with the third threshold, and outputs a high-level signal while the output voltage Vp of the power detector 2 is equal or higher than the third threshold. The output circuit outputs the convergence detection signal Vc while the second comparator outputs a high-level signal after the output of the first comparator changes from high level to low level. It is desirable that the first comparator is a comparator that uses hysteresis to avoid malfunction due to chattering.

A timing circuit 51 is configured to output a timing signal Vt while the packet detection signal Vpd is output from the packet detection circuit 4 and the convergence detection signal Vc is output from the convergence detection circuit 8. The timing circuit 51 can be formed by, for example, an AND circuit.

Figure 4:
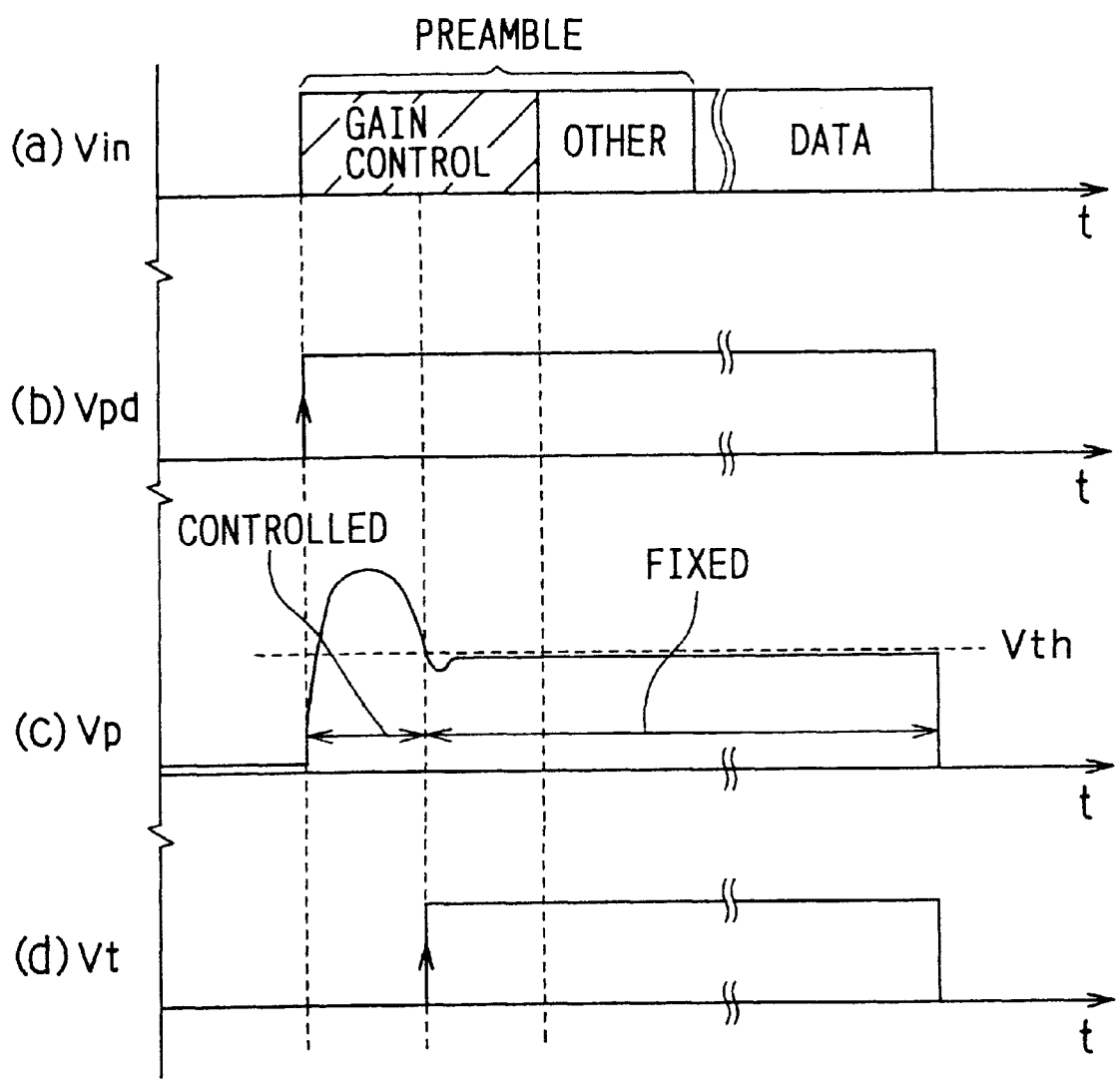
FIG. 4 is a timing chart of signals developed in various parts in the second embodiment.

In FIG. 4, signals developed in various parts in this embodiment are shown. (a) shows the input signal Vm of the gain control device, (b) shows the output signal Vpd of the packet detection circuit 4, (c) shows the output voltage Vp of the power detector 2 corresponding to the output power of the variable gain amplifier 1), and (d) shows the output signal Vt of the timing circuit 51.

While a packet signal is not received, the gain of the variable gain amplifier 1 is controlled by the feedback loop including the variable gain amplifier 1, the power detector 2, and the control circuit 3. When a packet signal is received, the gain of the variable gain amplifier 1 is also controlled by the above feedback loop. As a result the output power of the variable gain amplifier 1 will overshoot and thereafter converge. (see (c) in FIG. 4)

This convergent state is detected by the convergence detection circuit 8 based on the output voltage Vp of the power detector 2 and the convergence detection signal Vc is output from the convergence detection circuit 8. In response to this, a timing signal Vt is output from the timing circuit 51. Consequently the gain control device shifts from gain control mode to fixed gain mode in a similar way to the first embodiment.

Third Embodiment

Figure 5:
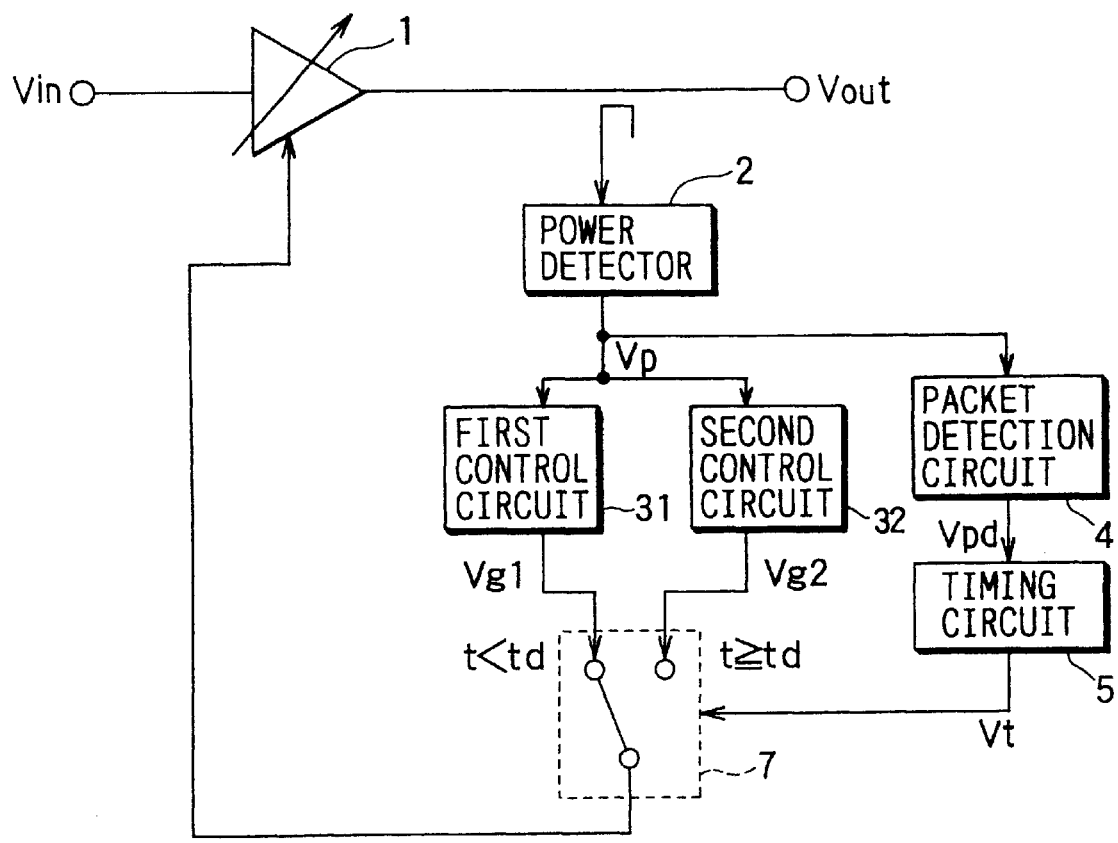
FIG. 5 is a block diagram showing a gain control device according to a third embodiment of the present invention.

In a third embodiment shown in FIG. 5, during a predetermined time td after the start of detection of a packet signal, the gain control device is in high-speed control mode in which a control constant is high. When the predetermined time td has elapsed, it operates in low-speed mode in which the control constant is low.

This gain control device includes a first control circuit 31 which outputs a first control voltage Vg1 for controlling the output power of the variable gain amplifier 1 at high speed with respect to a target value based on the output voltage Vp of the power detector 2, and a second control circuit 32 which outputs a second control voltage Vg2 for controlling the output power of the variable gain amplifier 1 at low speed with respect to the target value based on the output voltage Vp of the power detector 2.

The above control circuits 31, 32 include time constant filters, respectively. The first control circuit 31, in which the time constant of the time constant filter is small (the cutoff frequency is large), outputs the first control voltage Vg1 for controlling the output power of the variable gain amplifier 1 with respect to the target value at high speed. On the other hand, the second control circuit 32, in which the time constant of the time constant filter is large (the cutoff frequency is small), outputs the second control voltage Vg2 for controlling the output power of the variable gain amplifier 1 with respect to the target value at low speed.

Furthermore, in the present embodiment, the packet detection circuit 4, the timing circuit 5, the switch circuit 7, similar to those in the first embodiment, are included, but no sample-hold circuit is included.

Figure 6:
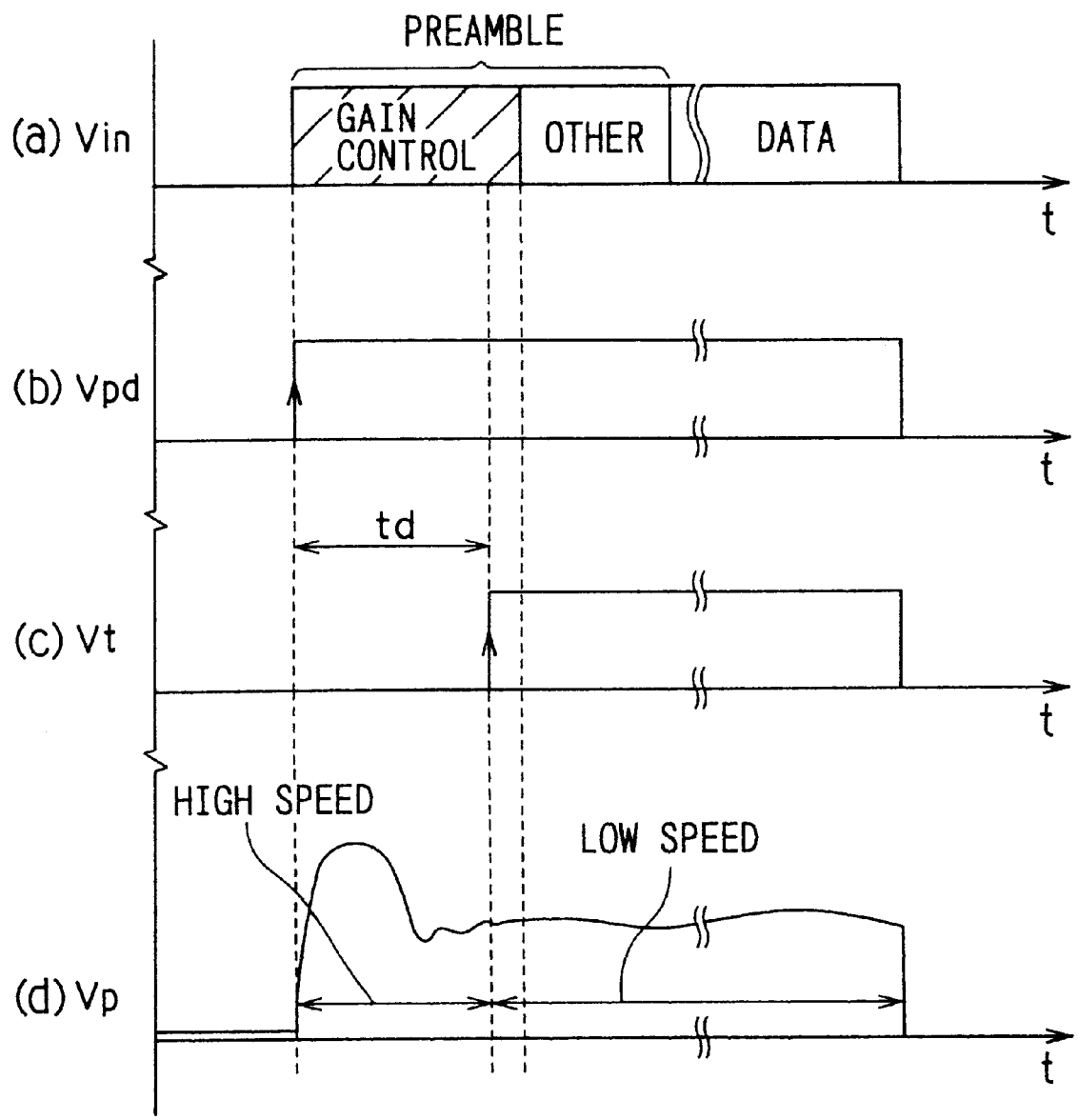
FIG. 6 is a timing chart of signals developed in various parts in the third embodiment.

In FIG. 6, (a) shows the input signal Vin for the gain control device, (b) shows the output signal Vpd of the packet detection circuit 4, (c) shows the output signal Vt of the timing circuit 5, and (d) shows the output voltage Vp of the power detector 2 corresponding to the output power of the variable gain amplifier 1.

While a packet signal is not received, the timing signal Vt is not output from the timing circuit 5. Thus, the switch circuit 7 provides the first control voltage Vg1 from the first control circuit 31 for the variable gain amplifier 1. In this way, gain control of the variable gain amplifier 1 is performed at high speed.

Thereafter, in response to reception of a packet signal, the packet detection signal is output from the packet detection circuit 4. However, the timing circuit 51 will not output a timing signal Vt during the predetermined time td after the start of outputting the packet detection signal Vpd. Thus gain control of the variable gain amplifier 1 is performed at high speed by use of the control voltage Vg1 from the first control circuit 31.

Thereafter, when the predetermined time td has elapsed, the timing circuit 5 starts to output the timing signal Vt and the switch circuit 7 provides the second control voltage Vg2 from the second control circuit 32 for the variable gain amplifier 1. In this way, gain control of the variable gain amplifier 1 is performed at low speed by use of the second control voltage Vg2 from the second control circuit 32.

Consequently, in the third embodiment, gain control is performed in high-speed control mode during the predetermined time td after the start of detection of a packet signal, and in low-speed mode after the elapse of the predetermined time td. The output power is controlled stably immediately in response to detection of the packet signal by the high-speed gain control. Thereafter, by the low-speed gain control, stable output power is output without distorting the signal wave.

Fourth Embodiment

Figure 7:
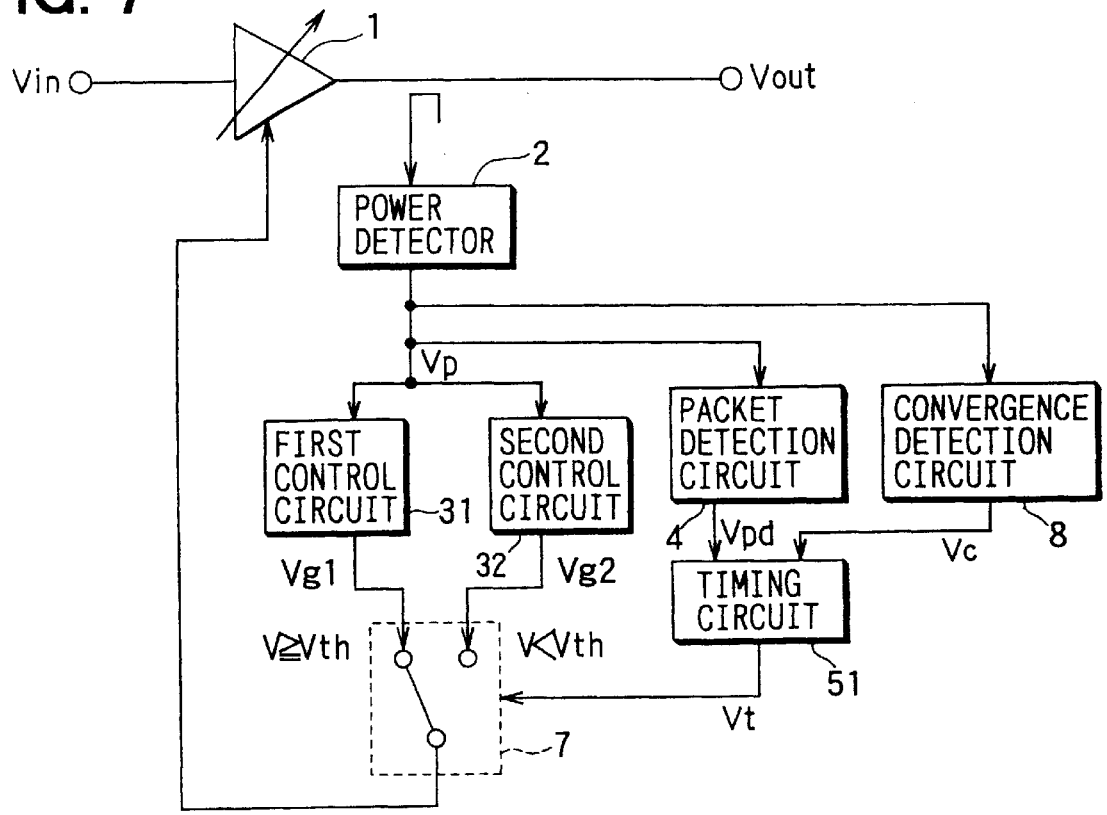
FIG. 7 is a block diagram showing a gain control device according to a fourth embodiment of the present invention.

In a fourth embodiment shown in FIG. 7, in contrast to the third embodiment, after the output voltage Vp of the power detector 2 exceeds the second threshold Vth, the gain control device shifts from high-speed control mode to low-speed mode if it is detected that the output voltage Vp of the power detector 2 is below the second threshold Vth and in a convergent state.

The gain control device according to the fourth embodiment includes a convergence detection circuit 8 and a timing circuit 51 similar to the second embodiment.

In the fourth embodiment, while a packet signal is not received, the gain of the variable gain amplifier 1 is controlled at high speed by the feedback loop that includes the variable gain amplifier 1, the power detector 2, and the first control circuit 31. After that, in response to reception of a packet signal, the gain of the variable gain amplifier 1 is controlled by the above feedback loop at high speed, so the output power of the variable gain amplifier 1 overshoots and thereafter converges.

This convergent state is detected by the convergence detection circuit 8 based on the output voltage Vp of the power detector 2, and a convergence detection signal Vc is output from the convergence detection circuit 8. In response to this, the timing signal Vt is output from the timing circuit 51. Accordingly the switch circuit 7 switches signal paths. As a result, the second voltage Vg2 from the second control circuit 32 is provided for the variable gain amplifier 1. Thus, the gain of the variable gain amplifier 1 is controlled at low speed.

Fifth Embodiment

Figure 8:
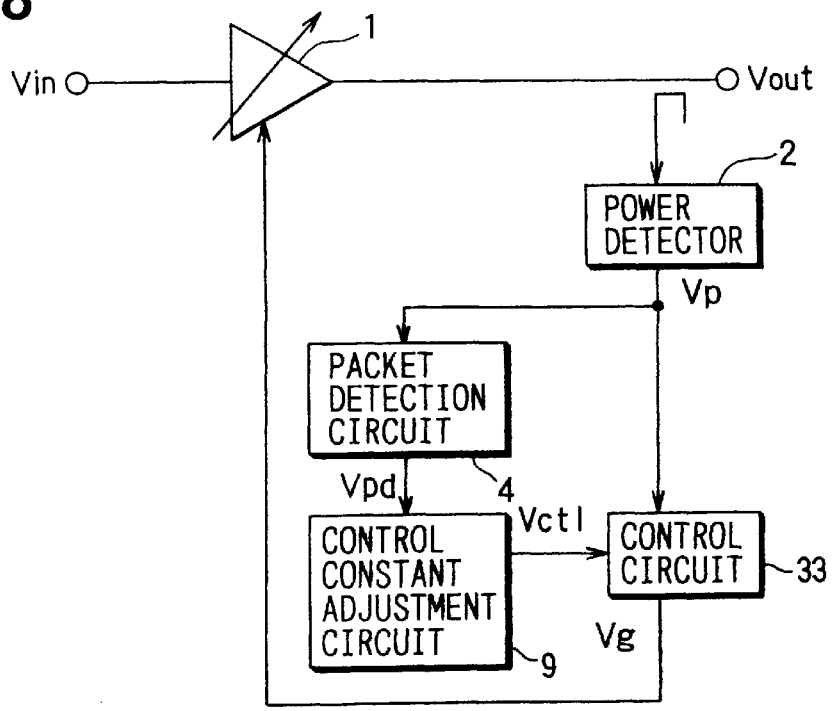
FIG. 8 is a block diagram showing a gain control device according to a fifth embodiment of the present invention.

In a fifth embodiment shown in FIG. 8, in contrast to the third embodiment, the gain control device is shifted from high-speed mode to low-speed mode by using one control circuit and changing its control constant.

The gain control device according to this embodiment includes a control constant adjustment circuit 9 which output a voltage Vct1 for adjusting the control constant of the control circuit 33. The control circuit 33 is configured to output a control voltage Vg corresponding to the control constant adjustment voltage Vct1.

Figure 9:
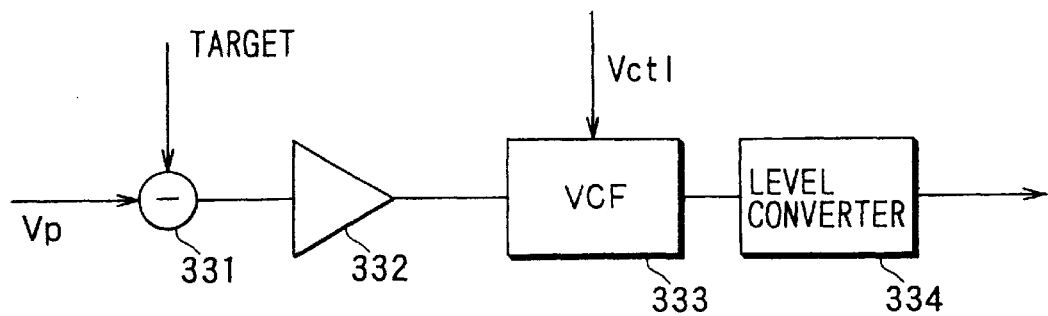
FIG. 9 is a block diagram showing the detailed construction of a control circuit shown in FIG. 8

In FIG. 9 the detailed construction of the control circuit 33 is shown. The control circuit 33 comprises a subtracter 331, an error amplifier 332, a voltage controlled filter (VCF) 333, and a level converter 334. The subtracter 331 generates a voltage difference of the output voltage Vp of the power detector 2 and a target voltage, and the error amplifier 332 amplifies the output from the subtracter 331. The control constant of the VCF 333 is set based on the control constant adjustment voltage Vct1 from the control constant adjustment circuit 9. The level converter 334 converts the level of the output voltage of the VCF 333. In the control circuits 3, 31, 32 of the first embodiment and the fourth embodiment, the VCF 333 shown in FIG. 9 is a time constant filter that has a fixed control constant (a time constant).

Figure 10:
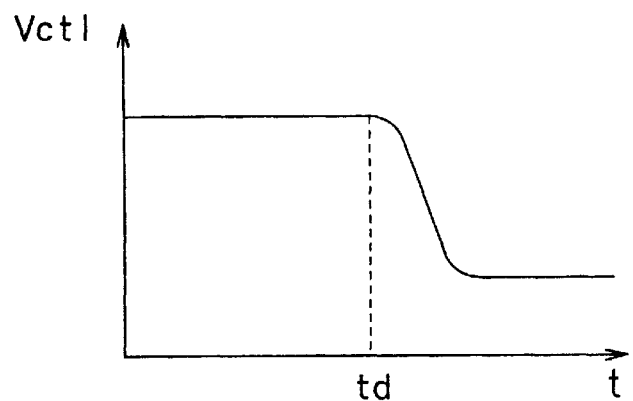
FIG. 10 is a characteristic diagram showing a pattern of control constant adjustment voltage Vct1 which is output from a control constant adjustment circuit shown in FIG. 8

The control constant adjustment circuit 9 outputs the control constant adjustment voltage Vct1 in the time-variable pattern shown in FIG. 10 in response to the packet detection signal Vpd from the packet detection circuit 4. That is, the control constant adjustment voltage Vct1 is set at a fixed high voltage level during the predetermined time td after the start of outputting the packet detection signal Vpd, and is decreased gradually after an elapse of the predetermined time td to a fixed low voltage level. Thus the control constant adjustment circuit 9 adjusts the control constant to a large value until the predetermined time td elapses after the start of detection of the packet signal, and adjusts it gradually to a small value after the elapse of the predetermined time td.

Therefore, according to the fifth embodiment, the gain control is performed at high speed by using a large control constant until the predetermined time td elapses after the start of detection of the packet signal. When the predetermined time td has elapsed, the gain control is performed at low speed by gradually decreasing the control constant. In this way, the output power is controlled stably immediately in response to detection of the packet signal by high-speed gain control. Thereafter, by low-speed gain control, stable power will be output without distorting the signal wave.

Sixth Embodiment

Figure 11:
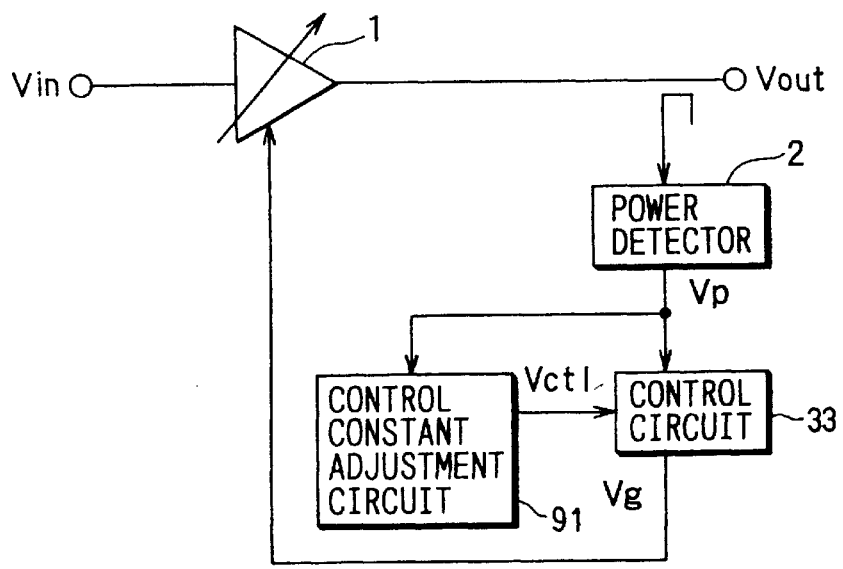
FIG. 11 is a block diagram showing a gain control device according to a sixth embodiment of the present invention.

In a sixth embodiment shown in FIG. 11, in contrast to the fifth embodiment, a control constant is changed corresponding to the output voltage Vp of the power detector 2.

This device includes a control constant adjustment circuit 91, which outputs a control constant adjustment voltage Vct1 corresponding to the output voltage Vp of the power detector 2. It changes the control constant adjustment voltage Vct1 corresponding to the output voltage Vp of the power detector 2, that is, raises the control constant adjustment voltage Vct1 corresponding to a rise in the output voltage Vp, and lowers the control constant adjustment voltage Vct1 corresponding to a drop in the output voltage Vp. A value of the control constant adjustment voltage Vct1 is determined from a value of the voltage Vp by using a predetermined function (for example, a linear function, a quadratic function, a logarithmic function, etc).

In the sixth embodiment, when a packet signal is received and the output power of the variable gain amplifier 1 overshoots, the output power is controlled stably immediately by high-speed gain control. Thereafter, stable power will be output without distorting the signal wave by performing low-speed gain control in response to convergence of the output power.

Seventh Embodiment

Figure 12:
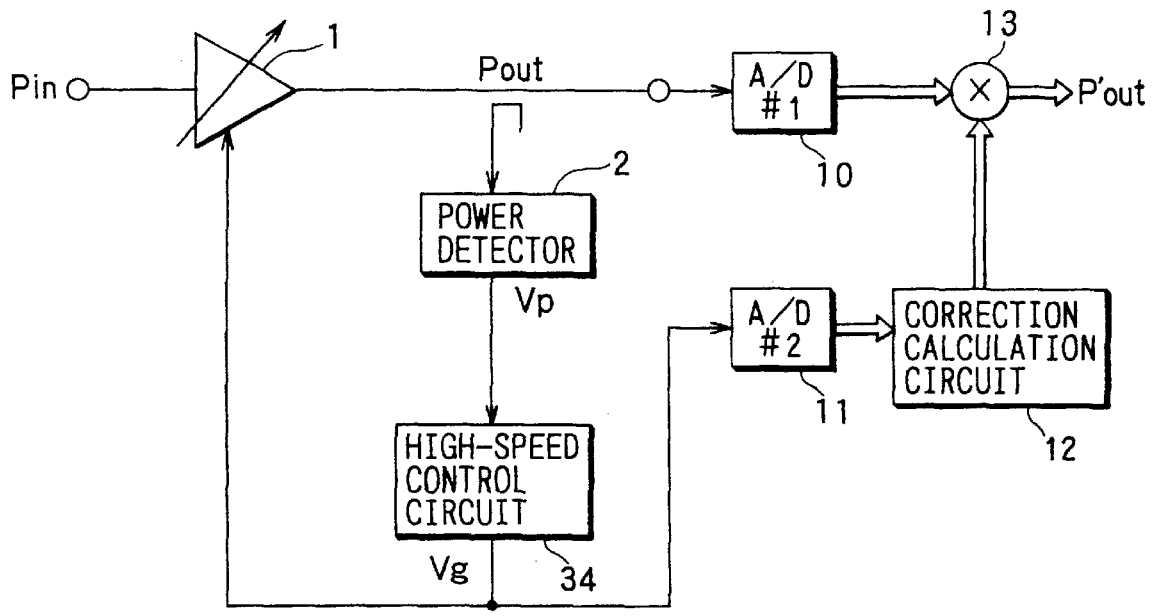
FIG. 12 is a block diagram showing a gain control device according to a seventh embodiment of the present invention.

In a seventh embodiment shown in FIG. 12, the power detector 2 detects output power of the variable gain amplifier 1, and, based on the output voltage Vp from the power detector 2, a high-speed control circuit 34 provides a control voltage Vg for performing high-speed gain control for the variable gain amplifier 1. By such a feedback loop, the output power of the variable gain amplifier 1 will be made to follow variation in the input signal Vin.

Figure 13:
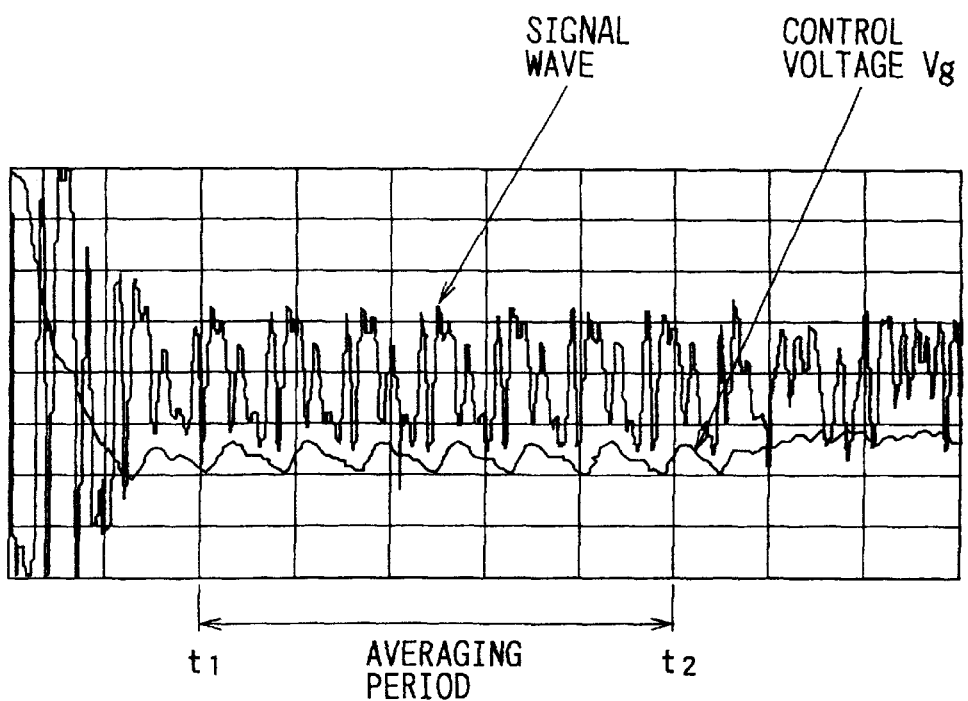
FIG. 13 is a timing chart showing the waveform of a signal wave from a variable gain amplifier and the waveform of output voltage Vg from a high-speed control circuit in the seventh embodiment.

In the feedback loop, the waveform of the signal wave from the variable gain amplifier 1 and the waveform of the output voltage Vg from the high-speed control circuit 34 were measured, and the result of this measurement is shown in FIG. 13. From this result, it is recognized that the control voltage Vg increases as the signal wave decreases, and the control voltage Vg decreases as the signal wave increases. Accordingly a stable signal wave can be obtained by compensating for the signal wave by the control voltage Vg.

In the present embodiment, a first A/D converter 10, a second A/D converter 11, a correction calculation circuit 12, and a multiplier 13 are provided. The first A/D converter 10 converts the output power of the variable gain amplifier 1 to a digital signal, and the second A/D converter 11 converts the control voltage Vg from the high-speed control circuit 34 to a digital signal. The correction calculation circuit 12 calculates a correction value based on the output from the second A/D converter 11, and the multiplier 13 performs multiplication for compensating for the output from the first A/D converter 10 by the correction value from the correction calculation circuit 12. In this way, a signal wave having stable power is output from the multiplier 13.

Calculation of the correction value in the above correction calculation circuit 12 may be performed as follows.

Assuming that the amplification factor (gain) of the variable gain amplifier is G, the output power $P_{out}$ of the variable gain amplifier 1 is expressed with respect to the input power $P_{in}$ by equation 1.

$$P_{out} = G \cdot P_{in} \quad \text{(Eq. 1)}$$

The amplification factor G is expressed using a function of the control voltage Vg by equation 2.

$$G = f(Vg) \quad \text{(Eq. 2)}$$

When equation 2 is substituted in equation 1, equation 3 is obtained.

$$P_{out} = f(Vg) \cdot P_{in} \quad \text{(Eq. 3)}$$

$P_{out}$ corresponds to the waveform of the signal wave sampled by the first A/D converter 10.

In order that the gain control of the variable gain amplifier 1 does not follow variation in the amplitude of the signal wave, the control voltage Vg needs to have a constant value with respect to time without the variation shown in FIG. 13. It is desirable to employ, as a constant value, an average of the control voltage Vg after the convergence of the feedback system including the power detector 2 and the high-speed control circuit 34. Assuming that the average of the control voltage Vg is Vm, Vm is obtained by equation 4.

$$Vm = \frac{1}{t_2 - t_1} \int_{t_1}^{t_2} Vg \, dt \quad \text{(Eq. 4)}$$

Here, t1 is set to be a time point after the feedback system has been controlled with respect to the target value, and t2−t1 needs to be sufficiently longer than the period of variation in the amplitude of the signal wave. When the above Vm is used, gain control of the variable gain amplifier 1 will not follow variation in the amplitude of the signal wave similarly to the case in which amplification is performed by the fixed gain. The output power $P'_{out}$ in this case is expressed by equation 5.

$$P'_{out} = f(Vm) \cdot P_{in} \quad \text{(Eq. 5)}$$

From equations 5 and 3, equation 6 can be obtained.

$$P'_{out} = \frac{f(Vm)}{f(Vg)} P_{out} \quad \text{(Eq. 6)}$$

In this equation, f (Vg) is the correction value, and this is calculated by the above correction calculation circuit 12.

If the variable gain amplifier 1 is a linear variable gain amplifier, the amplification rate G is expressed by equation 7.

$$G = f(Vg) = \alpha \cdot Vg + \beta \quad \text{(Eq. 7)}$$

In the case of the variable gain amplifier 1 whose gain varies in dB with respect to the control voltage Vg, the amplification factor G is expressed by equation 8.

$$G = f(Vg) = \gamma 10 \, \epsilon^{Vg} \quad \text{(Eq. 8)}$$

In equations 7 and 8, $\alpha, \beta, \gamma, \epsilon$ are constants specific to the variable gain amplifier 1, and they can be obtained from the characteristic table. However, they may be obtained by measuring the relation between Vg and G beforehand.

Other Embodiments

In the first, third, and fifth embodiments, the predetermined time td need not be a fixed value, and may be a variable value. For example, the time td may be adjusted corresponding to the output power of the variable gain amplifier 1 which is detected by the power detector 2. Specifically, the time td is set longer when the difference between the output power of the variable gain amplifier 1 and the target value is large, but it is set shorter when the difference is small.

In the above first, third, fifth, and seventh embodiments, the gain control that is performed by a feedback loop (closed-loop) is described. In this case, the power detector 2 is connected to the output side of the variable gain amplifier 1 to detect the output power of the variable gain amplifier 1. However, the power detector 2 may be connected to the input side of the variable gain amplifier 1. In this case, gain control is performed by an open-loop. In contrast to this, in the above second, fourth, sixth embodiment, gain control needs to be performed by a feedback loop, because the output power of the variable gain amplifier 1 needs to overshoot.

What is claimed is:

1. A gain control device comprising:

a variable gain amplifier for amplifying an input signal with a gain corresponding to a control voltage applied thereto;

a power detector for outputting an output voltage corresponding to an input power or an output power of said variable gain amplifier;

a first control circuit for outputting a first control voltage based on the output voltage of said power detector for controlling the output power of said variable gain amplifier with respect to a target value at high speed;

s second control circuit for outputting a second control voltage based on the output voltage of said power detector for controlling the output power of said variable gain amplifier with respect to the target value at low speed;

a packet detection circuit for detecting a packet signal by means of the output voltage of said power detector and outputting a packet detection signal; and a circuit means for providing the first control voltage from said first control circuit for said variable gain amplifier during a predetermined time after a start of outputting of the packet detection signal from said packet detection circuit, and providing the second control voltage from said second control circuit for said variable gain amplifier after an elapse of the predetermined time.

2. Again control device as set forth in claim 1, wherein said circuit means includes:

a timing circuit for outputting a timing signal after an elapse of the predetermined time after the start of outputting of the packet detection signal from said packet detection circuit; and a switch circuit for providing the first control voltage from said first control circuit for said variable gain amplifier until the timing signal is output from said timing circuit, and providing the second control voltage from said second control circuit for said variable gain amplifier in response to outputting of the timing signal.

3. A gain control device as set forth in claim 1, wherein the packet signal includes a preamble, and the predetermined time is shorter than the receiving time of the preamble but longer than the time the output power of said variable gain amplifier converges to the target value.

4. A gain control device as set forth in claim 3, wherein the preamble includes a preamble portion for gain control, and the predetermined time is shorter than the receiving time of the preamble portion for gain control.

5. A gain control device as set forth in claim 2, wherein the packet signal includes a preamble, and the predetermined time is shorter than the receiving time of the preamble but longer than the time the output power of said variable gain amplifier converges to the target value.

6. A gain control device as set forth in claim 5, wherein the preamble includes a preamble portion for gain control, and the predetermined time is shorter than the receiving time of the preamble portion for gain control.

* * * * *